United States Patent
Thoener et al.

(10) Patent No.: US 8,173,901 B2
(45) Date of Patent: May 8, 2012

(54) MULTIFILAMENT SUPERCONDUCTOR, AS WELL AS METHOD FOR ITS PRODUCTION

(75) Inventors: Manfred Thoener, Biebergmuend (DE); Horst Ehser, Kahl (DE); Andreas Szulczyk, Linsengericht (DE); Alfred Auer, Birstein (DE); Vital Abaecherli, Erlensee (DE)

(73) Assignee: European Advanced Superconductor GmbH & Co. KG, Hanau (DE)

( * ) Notice: Subject to any disclaimer, the term of this patent is extended or adjusted under 35 U.S.C. 154(b) by 388 days.

(21) Appl. No.: 12/104,189

(22) Filed: Apr. 16, 2008

(65) Prior Publication Data

US 2009/0038822 A1 Feb. 12, 2009

(30) Foreign Application Priority Data

Apr. 18, 2007 (DE) .......................... 10 2007 018 269

(51) Int. Cl.
*H01B 12/00* (2006.01)
(52) U.S. Cl. .................................... 174/125.1; 174/15.4
(58) Field of Classification Search ............... 174/125.1, 174/15.4; 505/230–232, 704, 925, 926; 257/661–663
See application file for complete search history.

(56) References Cited

U.S. PATENT DOCUMENTS

| | | | |
|---|---|---|---|
| 3,983,521 A * | 9/1976 | Furuto et al. .................. | 335/216 |
| 4,411,959 A | 10/1983 | Braginski et al. ............. | 428/558 |
| 7,514,634 B2 | 4/2009 | Roth et al. ................. | 174/125.1 |
| 2003/0024730 A1 * | 2/2003 | Otto et al. .................. | 174/125.1 |
| 2007/0021306 A1 * | 1/2007 | Flukiger et al. ............... | 505/230 |
| 2008/0196923 A1 * | 8/2008 | Susai et al. ................. | 174/110 R |
| 2010/0093546 A1 * | 4/2010 | Schlenga et al. ............. | 505/231 |

FOREIGN PATENT DOCUMENTS

| | | |
|---|---|---|
| DE | 3329390 | 2/1985 |
| DE | 10 2004 035 852 | 3/2006 |
| JP | 62272412 | * 11/1987 |
| JP | 09282953 | * 10/1997 |
| JP | 11238418 | 8/1999 |
| WO | WO 02/081192 | 10/2002 |

OTHER PUBLICATIONS

German Office Action to DE 10 2007 018 269.6-34 dated Jan. 15, 2010, 5 pages.
German Search Report; Application No. 08006498.3-2222/1983582; 9 pages, Jul. 29, 2011.
A. Godeke; "A review of the properties of Nb3Sn and their variation with A15 composition, morphology and strain state"; Supercond. Sci. Technol.; vol. 19; R68-R80, 2006.
Vidal et al.; "Effects of size and geometry on the plasticity of high-strength copper/tantalum nanofilamentary conductors obtained by severe plastic deformation"; Acta Materialia, vol. 54; pp. 1063-1075, 2006.

* cited by examiner

*Primary Examiner* — Yuriy Semenenko
(74) *Attorney, Agent, or Firm* — Baker Botts L.L.P.

(57) ABSTRACT

A multifilament superconductor (1) has a core area (2), several superconductor filaments (7) and reinforcement filaments (6). The superconductor filaments (7) and the reinforcement filaments (6) are arranged, so that they have a regular two-dimensional matrix (5) in the cross-section of core area (2). The reinforcement filaments (6) consist of tantalum or a tantalum alloy, and the superconductor filaments (7) each have a core (8), made from a powder metallurgically produced superconductor, which is enclosed by an inner shell (9), made of a non-superconducting metal or a non-superconducting alloy. The core area (2) is enclosed by an outer shell (3), made of a non-superconducting metal or a non-superconducting alloy.

12 Claims, 3 Drawing Sheets

MULTIFILAMENT SUPERCONDUCTOR, AS WELL AS METHOD FOR ITS PRODUCTION

CROSS-REFERENCE TO RELATED APPLICATIONS

This application claims priority to German Patent Application Number 10 2007 018 269.6 filed on Apr. 18, 2007, and which is incorporated herein by reference in its entirety.

TECHNICAL FIELD

The invention concerns a multifilament superconductor, especially a reinforced multifilament superconductor, as well as a method for its production.

BACKGROUND

A15 superconductors, like $Nb_3Sn$, can be produced by different methods in the form of a wire or strip. Known methods are the so-called bronze method, the jellyroll method, as well as the powder-in-tube method. A15 superconductors, which are produced by the powder-in-tube method, have the advantage that they can have the highest critical current densities. Consequently, the superconductors produced according to the powder-in-tube method are suitable for use in highly compacted and inexpensive magnetic systems.

The high current density and the high magnetic fields generated on this account, however, lead to increasing Lorentz forces in the magnet winding. These Lorentz forces can reduce the current carrying capacity of the superconducting wire of the magnet winding and therefore limit the area of application of the powder-in-tube wire.

SUMMARY

A mechanically reinforced superconductor based on powder-in-tube can be provided, which is also suitable for compact magnet systems. According to an embodiment, a method for production of a reinforced multifilament superconductor, may comprise the following steps: Preparation of several superconductor rods, each of which comprise at least one powder metallurgical core from the elements of a metallic superconductor core, wherein the core is enclosed by an inner shell made of a non-superconducting metal or a non-superconducting alloy, Preparation of several reinforcement rods, each of which consists of tantalum or a tantalum alloy, Arrangement of the superconductor rods and the reinforcement rods into a bundle, the superconductor rods and the reinforcement rods being arranged such that they form a regular two-dimensional matrix in the cross-section of the bundle, Enclosure of the bundle with the outer shell made of a non-superconducting metal or a non-superconducting alloy, Deformation of the enclosed bundle with reduction of the cross-section of the enclosed bundle to produce a multifilament, Annealing of the deformed multifilament at a temperature and for a sufficient period of time, so that superconducting phases are formed in the powder metallurgical cores.

According to a further embodiment, for formation of the bundle, the reinforcement rods may be arranged in the matrix around the superconductor rods. According to a further embodiment, the reinforcement rods may be arranged only in the edge area of matrix. According to a further embodiment, the reinforcement rods may be arranged with an azimuthal symmetry in matrix. According to a further embodiment, the reinforcement rods may be arranged distributed over the cross-section of the matrix. According to a further embodiment, the reinforcement rods may be arranged with axial symmetry in matrix. According to a further embodiment, the superconductor rods and the reinforcement rods may have essentially the same cross-sectional surface. According to a further embodiment, the superconductor rods, as well as the reinforcement rods, each may have a hexagonal cross-section. According to a further embodiment, the percentage of reinforcement rods may lie between about 10% and about 25% of the total number of rods of the matrix. According to a further embodiment, the powder metallurgical cores of the superconductor rods each may have the components of an A15 superconductor. According to a further embodiment, the powder metallurgical cores of the superconductor rods each may have powder from NbTa, $Nb_2Sn$ and Sn. According to a further embodiment, annealing may be carried out at 500° C. to 700° C. for 2 to 20 days. According to a further embodiment, the reinforcement rods each may have a core made of tantalum or a tantalum alloy, enclosed with a shell made of Cu. According to a further embodiment, the reinforcement rods may be produced by extrusion. According to a further embodiment, the superconductor rods may be produced by a powder-in-tube method. According to a further embodiment, the multifilament may be produced with the shape of a wire or the shape of a strip by chipless machining of the enclosed bundle.

According to another embodiment, a multifilament superconductor may comprise a core area, several superconductor filaments and reinforcement filaments, wherein the superconductor filaments and the reinforcement filaments are arranged such that they have a regular two-dimensional matrix in the cross-section of the core area, and the core area being enclosed by an outer shell made of an non-superconducting metal or a non-superconducting alloy, wherein the reinforcement filaments consist of tantalum or a tantalum alloy, and the superconductor filaments each have a core made of a powder metallurgical superconductor, which is enclosed by an inner shell made of a non-superconducting metal or a non-superconducting alloy.

According to a further embodiment, the multifilament superconductor may have the shape of a wire or strip. According to a further embodiment, the reinforcement filaments may be arranged in the matrix or on the superconductor filaments. According to a further embodiment, the reinforcement filaments may be arranged only in the edge area of matrix. According to a further embodiment, the reinforcement filaments may be arranged with azimuthal symmetry in matrix. According to a further embodiment, the reinforcement filaments may be arranged distributed over the cross-section of matrix. According to a further embodiment, the reinforcement filaments may be arranged with axial symmetry in matrix. According to a further embodiment, the superconductor filaments and the reinforcement filaments each may have roughly the same cross-sectional area. According to a further embodiment, the percentage of reinforcement filaments may lie between about 10% and about 25% of the total number of filaments of the matrix. According to a further embodiment, the superconductor filaments, as well as the reinforcement filaments, each may have a hexagonal cross-section. According to a further embodiment, the cores of superconductor filaments each may have the components of an A15 superconductor. According to a further embodiment, the cores of the superconductor filaments each may have $(Nb, Ta)_3Sn$ or $Nb_3Sn$ or $Nb_3Al$ or $Nb_3Si$ or $Nb_3Ge$ of $V_3Si$ or $V_3Ga$. According to a further embodiment, the reinforcement filaments each may have a core of tantalum or a tantalum alloy, enclosed with a shell made of copper.

BRIEF DESCRIPTION OF THE DRAWINGS

The invention is further explained now by means of the accompanying figures.

DETAILED DESCRIPTION

Figure 1:
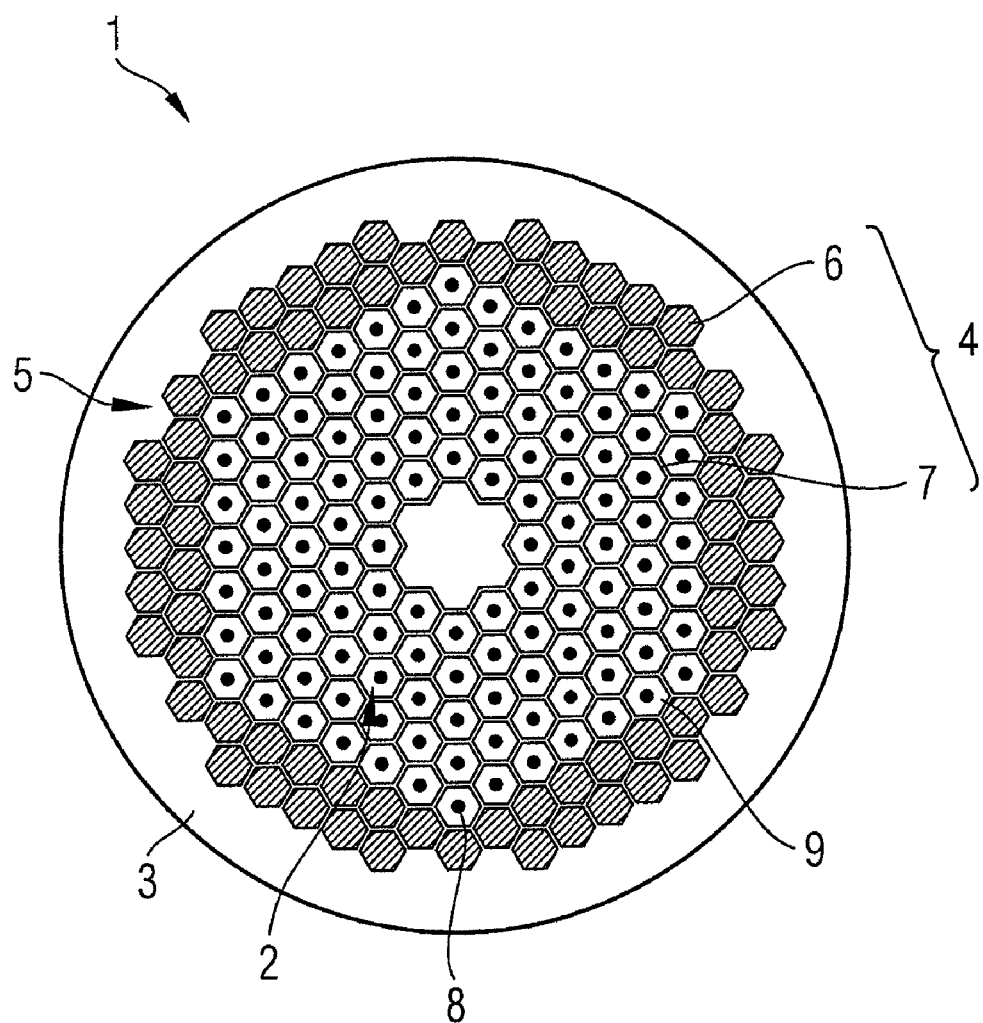
FIG. 1 shows a reinforced multifilament superconductor according to a first variant.

As stated above, according to an embodiment, a method for production of a reinforced multifilament superconductor may have the following steps: several superconductor rods are prepared, each of which has at least one powder metallurgical core from the elements of a metal superconductor. The powder metallurgical cores are each enclosed by an inner shell made of a non-superconducting metal or a non-superconducting alloy. Several reinforcement rods, each of which consist of tantalum or a tantalum alloy, are prepared. The superconductor rods and the reinforcement rods are arranged in a bundle in such a way, that they form a regular two-dimensional matrix in the cross-section of the bundle. The bundle is enclosed with an outer shell made of a non-superconducting metal or a non-superconducting alloy, and the enclosed bundle is subjected to chipless machining with reduction of the cross-section of the enclosed bundle, in order to produce a multifilament. The deformed multifilament is annealed at a temperature and for a time, in which the temperature and the time is adequate for annealing, so that the superconducting phases are formed in the powder metallurgical cores.

Through this method, a multifilament superconductor is produced by means of a powder metallurgical process, which has several reinforcement filaments arranged in the core area of the multifilament. The reinforcement filaments provide mechanical reinforcement of the multifilament, so that the yield point of the multifilament is increased. Consequently, the yield point of the multifilament superconductor is increased in use and the current capability of the multifilament superconductor increased. The area of application of this mechanically reinforced multifilament superconductor is therefore broadened.

The outer shell of the multifilament can consist of copper, since the mechanical reinforcement of the multifilament occurs by the reinforcement filaments arranged in the core area. The outer shell, in one variant, can be designed without an alloy for mechanical reinforcement of the outer shell. The arrangement of several reinforcement filaments in the core area has the advantage that the reinforcement filaments can be used with the usual methods. This can occur during production of the bundle by replacing some superconductor rods of the regular two-dimensional matrix with reinforcement rods.

The cross-section of the enclosed bundle can be reduced by ordinary chipless machining methods, in which the length is simultaneously increased, so that an elongated multifilament is produced from the bundled rods. The cross-section can be reduced by methods, like drawing and hammering, optionally with intermediate annealings. The filaments of the multifilament essentially retain the arrangement of rods of the bundle. The multifilament therefore has a regular two-dimensional matrix of filaments in cross-section, whose pattern corresponds to the pattern of the rods of the bundle matrix. In this context, the cross-section refers to the cross-section perpendicular to the length of the multifilament, as well as perpendicular to the length of the rods. By chipless machining of the enclosed bundle by drawing or hammering, a multifilament can be produced in the form of a wire or in the form of a strip.

Reinforcement filaments made of tantalum or a tantalum alloy then have the advantage that they can be integrated with the other components of the multifilament, because of their favorable deformation resistance. The other components of the multifilament are then the superconductor filaments, as well as the outer shell. Tantalum, at the same time, is a metal that maintains its high mechanical properties during the typical reaction conditions and treatments for formation of the superconductor phase. Tantalum also has an extremely high E-modulus even after heat treatment at the typical use temperatures in a range from 1.8 K to 10 K.

The percentage of tantalum of the reinforcement filaments can be adjusted. The reinforcement filaments, in one variant, essentially consist of tantalum or tantalum alloy. In another variant, the reinforcement rods can each have a core made of tantalum or a tantalum alloy enclosed with a shell made of Cu. These reinforcement rods can be produced by extrusion, especially by hydrostatic extrusion. Extrusion permits good joining between the tantalum core and the copper shell.

The reinforcement rods can be arranged in different patterns in the bundle matrix during bundling. In one variant, during formation of the bundle, the reinforcement rods are arranged around the superconductor rods in the matrix. In another variant, the reinforcement rods are arranged only in the edge area of the matrix. The reinforcement rods therefore form an annular pattern around the superconductor rods and are arranged between the superconductor rods and the outer shell. In a modification, the reinforcement rods are arranged with azimuthal symmetry in the matrix. An azimuthal symmetric arrangement of the reinforcement rods has the advantage that the mechanical reinforcement is distributed more uniformly over the bundle and the multifilament.

In another variant, reinforcement rods are arranged distributed over cross-section of the matrix. The reinforcement rods can be enclosed with superconductor rods. In a modification of this variant, the reinforcement rods are arranged axially symmetric in the matrix. This axial symmetric arrangement also provides for more uniform mechanical reinforcement of the overall cross-section of the multifilament. The symmetric arrangement, reinforced by filaments, has the additional advantage that the deformation behavior of the multifilament is optimized.

The superconductor rods and the reinforcement rods can have essentially the same cross-section area. This simplifies formation of the bundle and formation of a regular two-dimensional matrix. In another variant, the superconductor rods, as well as the reinforcement rods, each have a hexagonal cross-section. A heat exchanger cross-section permits tight packing of the rods in the matrix, for which reason the current conductivity of the multifilament can be increased.

The percentage of reinforcement rods can lie between about 10% and about 25% of the total number of rods of the matrix. This percentage can be adapted to the mechanical properties of the multifilament that are required for a specific magnet system. The number of reinforcement rods can be arbitrarily adjusted, so that the desired percentage is achieved. For example, if the total matrix has 192 filaments, the matrix can have 36 reinforcement rods, so that the multifilament has a percentage of reinforcement rods of about 10%. If 72 of the total of 192 filaments are reinforcement rods, the filaments have a reinforcement percentage of about 20%.

The method is therefore flexible, since the mechanical properties of the multifilament can be simply adjusted, so that a multifilament with the desired mechanical reinforcement can be provided. The mechanical properties can therefore be easily adjusted to the special requirement profile of the application.

The powder metallurgical cores of the superconductor rods can each have the components of an A15 superconductor. The powder metallurgical cores of the superconductor rods can also each have powders of NbTa, $Nb_2Sn$ and Sn, in which the superconducting phase $(Nb, Ta)_3Sn$ is formed from these components.

The superconductor rods can be produced by a powder-in-tube method, in which powder of the desired component is formed into a core, which is enclosed with a shell of a non-superconducting metal or non-superconducting alloy. This preliminary product is optionally deformed with intermediate annealings, the cross-section being reduced and the length increased, in order to produce the superconductor rods. These superconductor rods are arranged, together with the reinforcement rods, into a bundle. The superconducting phase is only produced after bundling and after the initial deformation steps to produce the multifilament. To form the superconducting phases in the cores of the superconductor filaments, annealing of the multifilament can be carried out at 500° C. to 700° for 2 to 20 days.

A multifilament superconductor can also have a core area, having several superconductor filaments and reinforcement filaments. The superconductor filaments and the reinforcement filaments are then arranged, so that they have a regular two-dimensional matrix in the cross-section of the core area. The core area is enclosed by an outer shell made of a non-superconducting metal or a non-superconducting alloy. The reinforcement filaments essentially consist of tantalum or a tantalum alloy. The superconductor filaments each have a core made of a powder metallurgically produced superconductor, which is enclosed by an inner shell made of a non-superconducting metal or a non-superconducting alloy.

The multifilament is therefore mechanically reinforced, because of the reinforcement element, and can have the configuration of a wire or the configuration of a strip. The reinforcement filaments can be arranged, for example, in the matrix around the superconductor filaments. The reinforcement filaments can also be arranged only in the edge area of the matrix. For example, the reinforcement filaments are arranged azimuthally symmetric in the edge area of the matrix.

In another variant, the reinforcement filaments are arranged distributive over the cross-section of the matrix. The reinforcement filaments are therefore not only arranged on the edge of the core area and can be enclosed by superconductor filaments. In one variant, the reinforcement filaments are arranged axially symmetric in the matrix.

The arrangement and pattern of the filaments of the multifilament correspond to the arrangement and the pattern of the rods of the bundle, since the original arrangement and the original pattern are essentially retained during deformation of the bundle. In comparison with the rods, the filaments have a smaller cross-section and a greater length.

The superconductor filaments and the reinforcement filaments of the multifilament can each have about the same cross-sectional area. The percentage of reinforcement filaments can lie between about 10% and about 25% of the total number of filaments of the matrix. In one variant, the superconductor filaments, as well as the reinforcement filaments, each have a hexagonal cross-section.

In one variant, the cores of the superconductor filaments each have the components of an A15 superconductor. The cores of the superconductor filaments can each have the components of the $(Nb, Ta)_3Sn$, $Nb_3Sn$, $Nb_3Al$, $Nb_3Si$, $Nb_3Ge$, $V_3Si$ or $V_3Ga$ phase or the superconducting $(Nb, Ta)_3Sn$ or $Nb_3Sn$ or $Nb_3Al$ or $Nb_3Si$ or $Nb_3Ge$ or $V_3Si$ or $V_3Ga$ phase. The reinforcement filaments can each have a core made of tantalum or a tantalum alloy, enclosed with a shell made of copper.

FIG. 1 shows the cross-section of a mechanically reinforced multifilament superconductor 1 with a core area 2 enclosed by an outer shell 3. The core area 2 includes 192 filaments 4. The filaments 4 each have a hexagonal cross-sectional surface, which is roughly equal for each filament. The filaments 4 are combined, in order to form a regular two-dimensional hexagonal matrix 5. The outer filaments 4 of matrix 5 are arranged, so that the outer edge of matrix 5 has an almost circular cross-section.

In this variant, 72 of the total of 192 filaments 4 are reinforcement filaments 6. The reinforcement filaments 6 each have a core, consisting essentially of tantalum, and an inner shell made of copper. The reinforcement elements 6 were formed by hydrostatic extrusion. The reinforcement filaments 6 were shown black in FIG. 1.

The remaining 120 filaments 4 are superconductor filaments 7, which are shown gray in FIG. 1. The superconductor filaments 7 each have a core 8 made of a powder metallurgical superconductor. The superconducting phase is $(Nb, Ta)_3Sn$. The core 8 is enclosed by an inner shell 9 made of copper. The superconductor filaments 7 were produced by a powder-in-tube method.

The reinforcement filaments 6 are arranged in the outer area of the core area and around the superconductor filaments 7. The reinforcement filaments 6 are arranged in the matrix 5 with an azimuthal symmetry, so that the mechanical reinforcement is uniformly distributed over the cross-section of multifilament 1.

In this variant, the inner central area of the core area has no superconductor filaments 7 or reinforcement filaments 6 and instead has copper.

To produce the multifilament 1, several superconductor rods and reinforcement rods are initially produced. To produce the superconductor rods, powder of the components of the superconducting phase are formed to a rod and then closed with a copper shell. The cross-section is reduced by drawing, in order to form hexagonal superconductor rods. Several reinforcement rods are produced by hydrostatic extrusion of the tantalum core enclosed with copper. The reinforcement rods also have a hexagonal shape. The cross-sectional area of the superconductor rods and reinforcement rods is roughly the same.

The longitudinal sides of the superconductor rods and reinforcement rods are combined and arranged into a bundle, which has a regular hexagonal matrix in cross-section. The reinforcement rods are arranged in the matrix, so that the matrix has the desired pattern of reinforcement rods and superconductor rods. The bundle is enclosed with the outer shell made of copper and the enclosed bundle deformed by drawing and intermediate annealing, the cross-section being reduced, the length increased and a multifilament 1 being produced. The arrangement of superconductor filaments 7 and reinforcement filaments 6 in matrix 5 of the produced multifilament 1 corresponds to the arrangement of the rods in the bundle. The multifilament 1 is then annealed at 500° C. to 700° C. for 2 to 20 days, so that the superconducting phase is formed from the powder in the powder metallurgical cores 8.

The second and third variant of the multifilament superconductor differ from the first variant of FIG. 1 by the number of reinforcement filaments 6 and their arrangement with a matrix 5. The arrangement of reinforcement filaments 6 and that of superconductor filaments 7 of matrix 5 was determined by the arrangement of rods during bundling.

Figure 2:
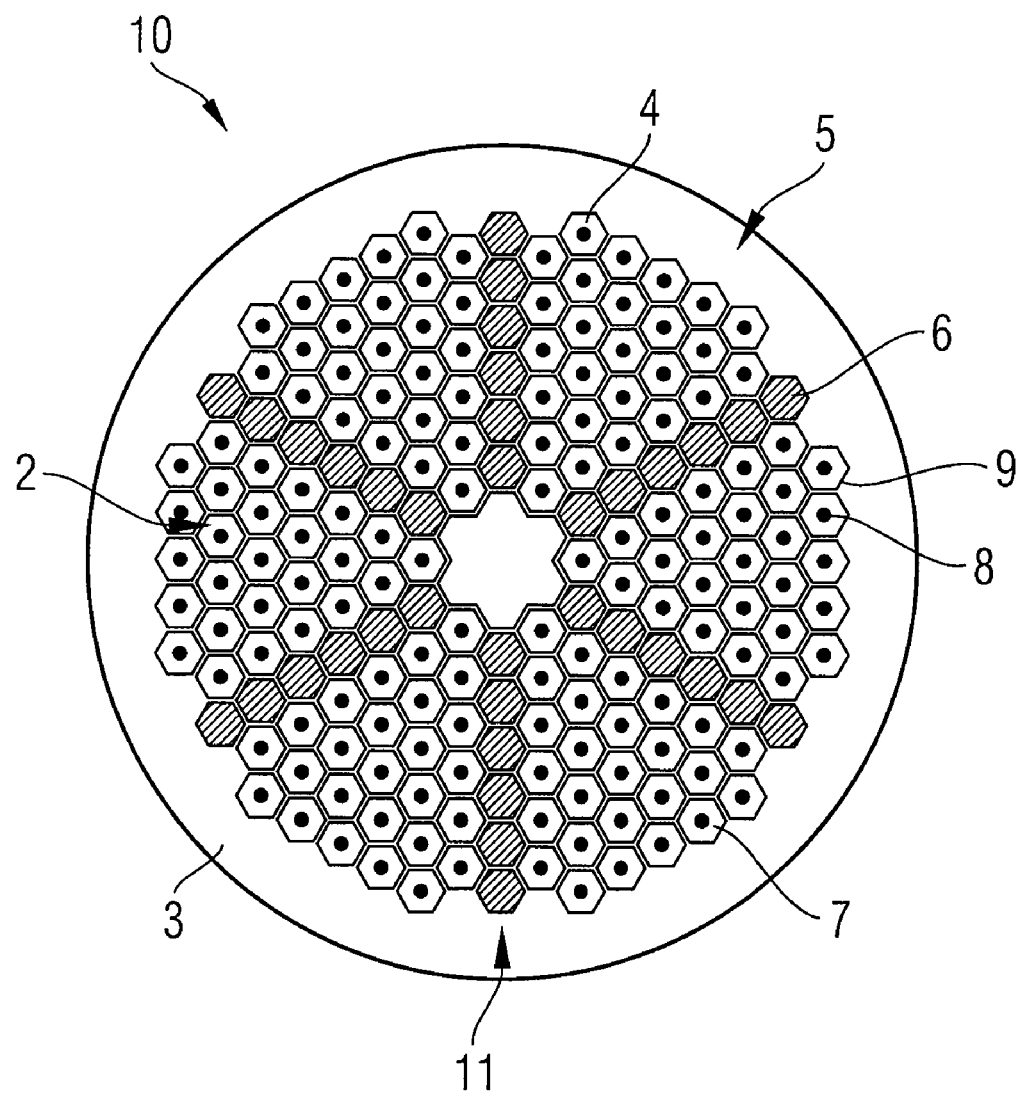
FIG. 2 shows a reinforced multifilament superconductor according to the second variant.

FIG. 2 shows a cross-section of a multifilament superconductor 10 according to a second variant. This second multifilament superconductor 10 also has 192 hexagonal filaments 4, which are arranged together in a matrix 5 with a hexagonal pattern, as in FIG. 1. In the second variant, 36 filaments 4 of the 192 filaments are the reinforcement filaments 6. The reinforcement percentage is therefore 18%. In contrast to the first variant depicted in FIG. 1, the reinforcement filaments 6 are not only arranged in the edge area of matrix, 5, but also distributed over the entire matrix 5. In this variant, the reinforcement filaments 6 are arranged with a radial symmetry in matrix 5. For this purpose, six rows 11 of reinforcement filaments 6, each of which has six reinforcement filaments 6, are provided. The six rows 11 are arranged radially symmetric in matrix 5. The angles between adjacent rows 11 are therefore about 60°.

Figure 3:
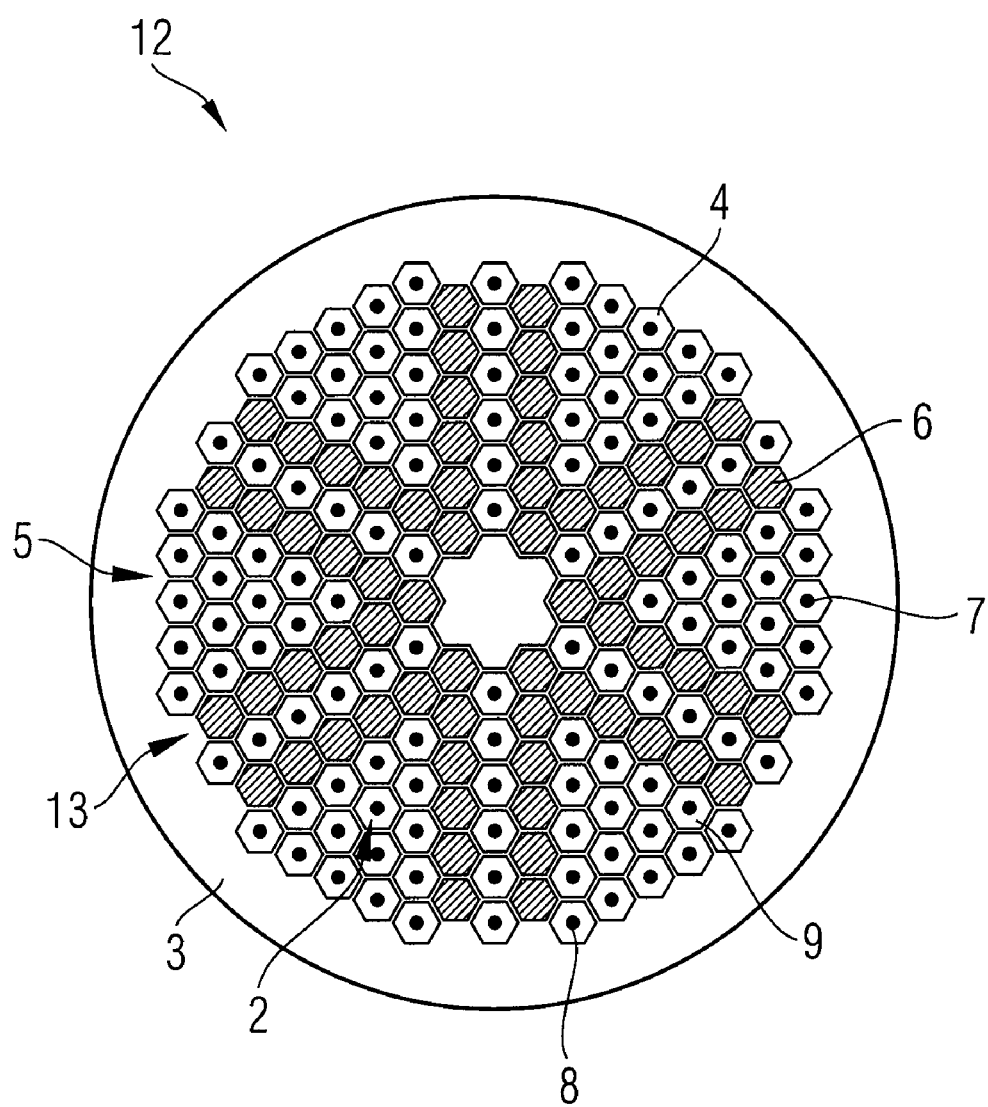
FIG. 3 shows a reinforced multifilament superconductor according to the third variant.

FIG. 3 shows a multifilament superconductor 12 according to a third variant. The third multifilament superconductor 12 also has a core area with 192 filaments arranged in a hexagonal matrix 5. In the third variant, 66 of 192 filaments 4 are reinforcement filaments 6. The third multifilament superconductor 12 has a reinforcement percentage of 20%.

The reinforcement filaments 6 are arranged with radial symmetry in matrix 5. For this purpose, six V-shaped arrangements 13 are provided, each of which has 11 reinforcement filaments 6. The tip of the V-shape 13 is aligned inward, so that the angle of two adjacent V-shapes lies roughly at 60° C. The sides of the V-shapes 13 are parallel to the sides of the adjacent V-shape, in which case one row of superconductor filaments 7 is arranged between two adjacent V-shapes 13.

The multifilaments 1, 10, 12 can be used for production of a magnet winding. The multifilaments 1, 10, 12 are mechanically reinforced by the reinforcement filaments 6, so that the yield point of the multifilaments 1, 10, 12 is increased. This leads to improved current carrying capacity, since the effect of the Lorentz force is reduced. Use of these multifilaments with powder metallurgical cores is therefore broadened.

LIST OF REFERENCE NUMBERS

1 First multifilament
2 Core area
3 Outer shell
4 Filament
5 Matrix
6 Reinforcement filament
7 Superconductor filament
8 Core of the superconductor filament
9 Inner shell of the superconductor filament
10 Second multifilament
11 Row of reinforcement filaments
12 Third multifilament
13 V-shape of the reinforcement filaments

What is claimed is:

1. A multifilament superconductor comprising:
a core area including several superconductor filaments and reinforcement filaments, each of the superconductor filaments and the reinforcement filaments having a hexagonal cross section, wherein:
the superconductor filaments and the reinforcement filaments are arranged such that they form a regular hexagonal matrix in the cross-section of the core area;
the reinforcement filaments are disposed in a radially symmetric pattern along the length of the core area and in the cross-section of the core area;
wherein each of two adjacent of the reinforcement filaments directly abut each other;
the core area being enclosed by an outer shell made of an non-superconducting metal or a non-superconducting alloy;
the reinforcement filaments consist of tantalum or a tantalum alloy; and
the several superconductor filaments each have a core made of a powder metallurgical superconductor, which is enclosed by an inner shell made of a non-superconducting metal or a non-superconducting alloy.

2. A multifilament superconductor according to claim 1, wherein the multifilament superconductor has the shape of a wire or strip.

3. A multifilament superconductor according to claim 1, wherein the reinforcement filaments are arranged in the matrix or on the superconductor filaments.

4. A multifilament superconductor according to claim 1, wherein the reinforcement filaments are arranged only in an edge area of the matrix.

5. A multifilament superconductor according to claim 1, wherein the reinforcement filaments are arranged with azimuthal symmetry in matrix.

6. A multifilament superconductor according to claim 1, wherein the reinforcement filaments are arranged distributed over the cross-section of matrix.

7. A multifilament superconductor according to claim 6, wherein the reinforcement filaments are arranged with axial symmetry in matrix.

8. A multifilament superconductor according to claim 1, wherein the superconductor filaments and the reinforcement filaments each have roughly the same cross-sectional area.

9. A multifilament superconductor according to claim 8, wherein the percentage of reinforcement filaments lies between about 10% and about 25% of the total number of filaments of the matrix.

10. A multifilament superconductor according to claim 1, wherein the cores of superconductor filaments each have the components of an A15 superconductor.

11. A multifilament superconductor according to claim 10, wherein the cores of the superconductor filaments each have $(Nb, Ta)_3Sn$ or $Nb_3Sn$ or $Nb_3Al$ or $Nb_3Si$ or $Nb_3Ge$ of $V_3Si$ or $V_3Ga$.

12. A multifilament superconductor according to claim 1, wherein the reinforcement filaments each have a core of tantalum or a tantalum alloy, enclosed with a shell made of copper.

* * * * *